United States Patent [19]
Palara et al.

[11] Patent Number: 5,735,254
[45] Date of Patent: Apr. 7, 1998

[54] CIRCUIT FOR DETECTING AN OVERVOLTAGE ON A SWITCHED INDUCTIVE LOAD

[75] Inventors: Sergio Palara, Acitrezza; Stefano Sueri, Catania; Salvatore Scaccianoce, Riposto, all of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 639,794

[22] Filed: Apr. 29, 1996

[30] Foreign Application Priority Data

Apr. 28, 1995 [EP] European Pat. Off. ............ 95830168

[51] Int. Cl.$^6$ .................................................. F02P 17/12
[52] U.S. Cl. ................................. 123/644; 73/117.3
[58] Field of Search ......................... 123/630, 644; 73/117.3; 324/380, 391, 399

[56] References Cited

U.S. PATENT DOCUMENTS

| | | | |
|---|---|---|---|
| 4,380,989 | 4/1983 | Takaki | 123/644 |
| 4,612,640 | 9/1986 | Mehrotra et al. | 371/51 |
| 4,750,467 | 6/1988 | Neuhalfen | 123/644 |
| 4,886,029 | 12/1989 | Lill et al. | 123/630 |
| 4,918,389 | 4/1990 | Schleupen et al. | 123/630 |
| 5,056,095 | 10/1991 | Horiguchi et al. | 371/40.1 |
| 5,063,565 | 11/1991 | Ohashi | 371/40.2 |
| 5,309,888 | 5/1994 | Deutsch et al. | 123/644 |
| 5,446,385 | 8/1995 | Kugler et al. | 123/644 |

FOREIGN PATENT DOCUMENTS

| | | |
|---|---|---|
| A-0 020 068 | 12/1980 | European Pat. Off. |
| A-0 141 743 | 5/1985 | European Pat. Off. |
| A-0 381 405 | 8/1990 | European Pat. Off. |
| A-0 386 431 | 9/1990 | European Pat. Off. |
| A-0 502 549 | 9/1992 | European Pat. Off. |

Primary Examiner—Willis R. Wolfe
Attorney, Agent, or Firm—Wolf, Greenfield & Sacks, P.C.; James H. Morris

[57] ABSTRACT

A circuit for use with an ignition system to enable detection of an overvoltage condition in the primary winding of an ignition coil caused by opening of a power switch connected to the primary winding. The circuit senses the overvoltage condition by comparing the voltage on the primary winding to a first threshold voltage and produces a signal at an output terminal indicative of the presence of the overvoltage condition. The output terminal is maintained at a high logic level upon detection of an overvoltage condition and throughout the time duration of the overvoltage condition, and drops to a low logic level when the voltage on the primary winding falls to a second threshold voltage, which is lower than the first threshold voltage. Comparison circuitry is provided for sensing the overvoltage condition by reference to fixed voltage values. Logic circuitry responds to the comparison circuitry to produce the appropriate logic levels at the output terminal.

24 Claims, 6 Drawing Sheets

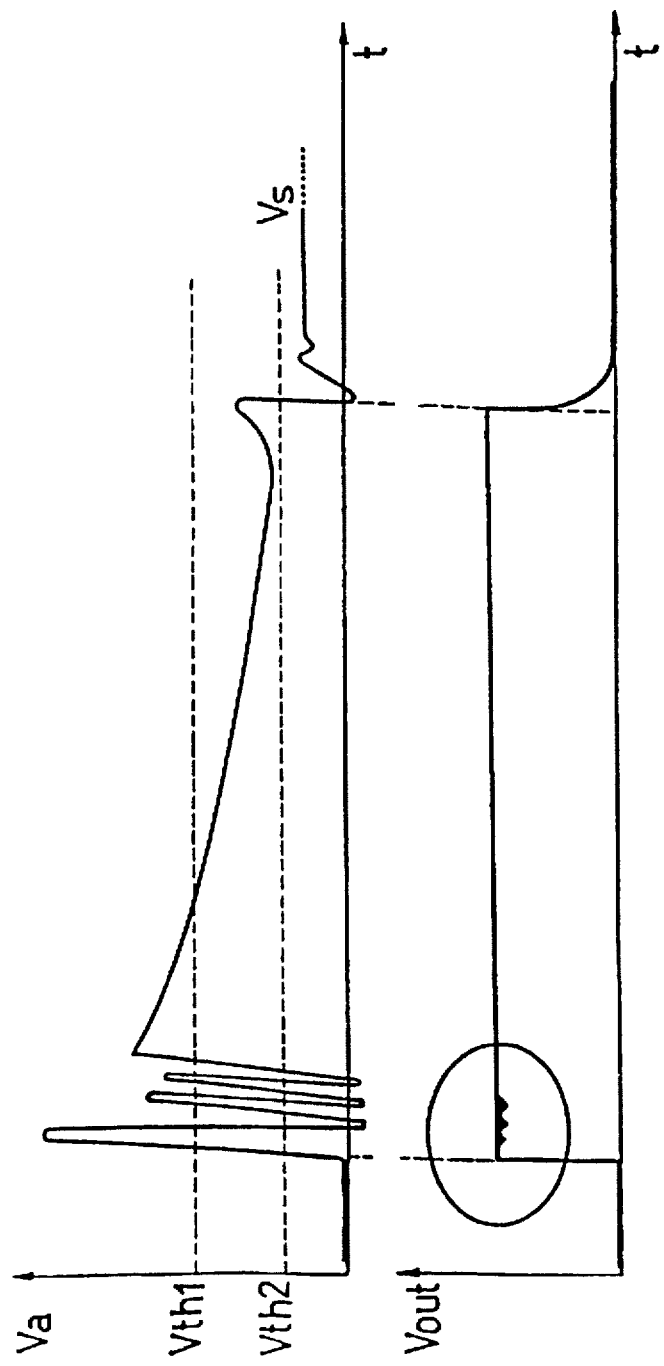

CIRCUIT FOR DETECTING AN OVERVOLTAGE ON A SWITCHED INDUCTIVE LOAD

BACKGROUND OF THE INVENTION

1. Field of the Invention

The present invention relates to overvoltage detection circuits, and in particular to a circuit for detecting an overvoltage on a switched inductive load.

2. Description of the Related Art

The invention has application in automotive electronic ignition systems. In particular for ease of understanding the description which follows is made with reference to a circuit for detecting the occurrence of an overvoltage in an ignition coil upon closing a series connected control switch.

In conventional electronic ignition systems used with internal combustion engines, it is necessary to detect whether a spark in the secondary winding of the ignition coil is present or absent during the exhaust stage. If a spark is determinated to be absent, it is necessary to take remedial action in order to avoid deterioration of the catalytic converter.

A known technical arrangement for meeting this need is described in European Patent Application 88108869.4. It discloses that the present or absence of a spark in the secondary winding of the engine's ignition coil should be detected by sensing changes in the voltage on the primary winding of the coil.

For a better understanding of this phenomenon we refer to FIG. 1. When a control switch S included in the electronic ignition system of an internal combustion engine closes, a current which increases linearly with time passes through the primary winding L' of the ignition coil L. Upon opening control switch S, the voltage Va present in the primary winding L' of ignition coil L increases rapidly. After a certain time interval, it reaches the value of the voltage Vs provided by the vehicle's battery. If no spark is produced by the secondary winding L" of the ignition coil L the behaviour of voltage Va is approximately that shown in FIG. 2. In this first situation the time duration of the overvoltage condition is approximately 100 μs.

If on the other hand there is a spark in the secondary winding L" of ignition coil L, the behaviour of voltage Va is that shown in FIG. 3. In this latter situation the overvoltage lasts approximately 2 ms. It will be noted that the time axes of the graphs of FIG. 2 and 3 are not draw to the same scale.

SUMMARY OF THE INVENTION

A principal object of the present invention is the provision of a circuit for correct and accurate determination of an overvoltage event in a switched inductive load, such as an automotive ignition coil.

The preferred embodiment of the invention is implemented in a circuit for use with an ignition system to enable detection of an overvoltage condition in the primary winding of an ignition coil caused by opening of a power switch connected to the primary winding. The circuit senses the overvoltage condition by comparing the voltage on the primary winding to a first threshold voltage and produces a signal at an output terminal indicative of the presence of the overvoltage condition. The output terminal is maintained at high logic level upon detection of an overvoltage condition and throughout the time duration of the overvoltage condition, and drops to a low logic level when the voltage on the primary winding falls to a second threshold voltage, which is lower than the first threshold voltage. Comparison circuitry is provided for sensing the overvoltage condition by reference to fixed voltage values. Logic circuitry responds to the comparison circuitry to produce the appropriate logic levels at the output terminal.

The features and advantages of the circuit according to the present invention will become apparent from the following description of an embodiment thereof, given by way of example and not limitation, with reference to the accompanying drawings.

BRIEF DESCRIPTION OF THE DRAWINGS

FIGS. 2 and 3 are graphs of the voltages present in the device in FIG. 1 under different conditions;

FIGS. 7 and 8 show the change in an output voltage of the circuit under the condition of FIG. 2 and 3, respectively.

DETAILED DESCRIPTION OF THE PREFERRED EMBODIMENT

The figures of the accompanying drawings generally and schematically illustrate a circuit in accordance with the invention for detecting an overvoltage event in a switched inductive load.

Figure 4:
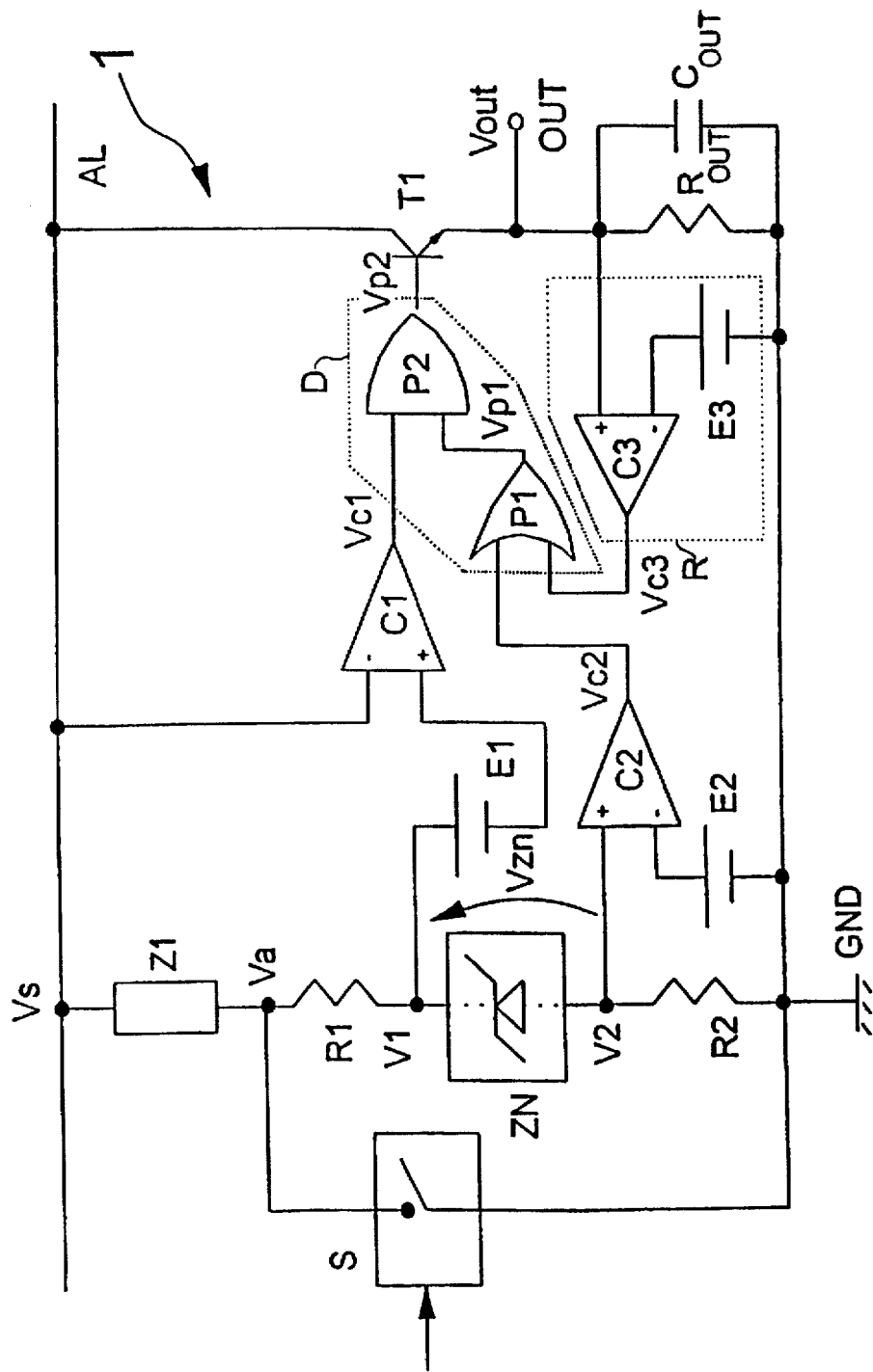
FIG. 4 is a block diagram of a circuit constructed according to the invention.

With particular reference to FIG. 4, a preferred embodiment of the inventive circuit is designated generally by reference number 1. The circuit 1 is connected across a feed line AL and a line at ground potential designated GND. The circuit 1 is connected with an inductive load Z1 as shown and includes a power switch S in series with the load Z1.

Circuit 1 includes a first threshold comparator C1 which has an output terminal for producing a voltage signal designated Vc1, a first input terminal held at a first reference voltage E1 and a second input terminal connected to the feed line AL. Circuit 1 also includes a second threshold comparator C2 which has a first input terminal held at a second reference voltage E2 and a second input terminal connected to a node having a voltage V2. The voltage V2 is determinated by a current passing through a resistor R2, which also passes through the electrical load Z1, a resistor R1 and a one-way block ZN, all connected together in series. The second comparator C2 has an output terminal for producing a voltage signal Vc2.

Circuit 1 also includes an output transistor T1, for example an NPN bipolar transistor, having a first terminal connected to the feed line AL, a second terminal connected to an output terminal OUT of the circuit 1 and a control terminal connected to a logic block D. The logic block D has inputs connected to the outputs of the threshold comparators C1 and C2. Circuit 1 also includes a feedback block R connected to the output terminal OUT of circuit 1 and a further input of the logic block D.

The feedback block R includes a third threshold comparator C3 having an output terminal for producing a voltage signal designated Vc3, a first input terminal held at a third reference voltage E3 and a second input terminal corresponding to the output terminal OUT of circuit 1.

The logic block D includes a first logic gate P1, for example of the OR type, having an output terminal for producing a voltage signal designated Vp1, a first input terminal connected to the output terminal of the second threshold comparator C2 and a second input terminal connected to the output terminal of the third threshold comparator C3. The logic block D also includes a second logic gate P2, for example of the AND type, having a first input terminal connected to the output terminal of first comparator C1 and a second input terminal connected to the output terminal of first logic gate P1. The second logic gate P2 also includes an output terminal for producing a voltage signal designated Vp2 for driving transistor T1. Finally, a capacitor Cout is connected between the output terminal OUT of circuit 1 and the ground terminal GND and a resistor Rout is connected in parallel with the capacitor.

Figure 5:
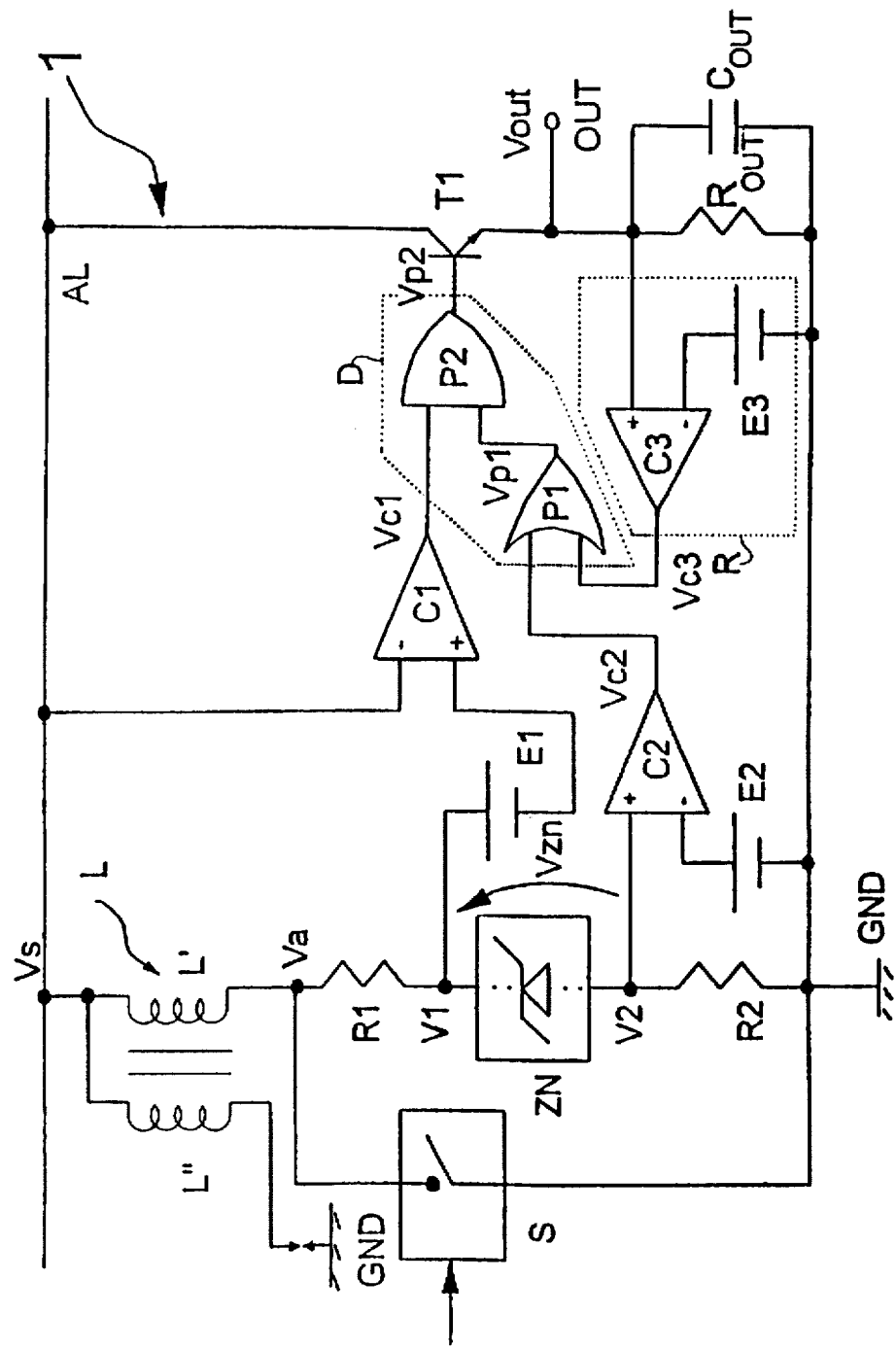
FIG. 5 shows a possible application of the circuit constructed according to the invention.

For convenience of description, the operation of circuit 1 according to the invention will now be described with reference to an application in which electrical load Z1 is of the inductive type, for example an engine's electronic ignition coil L comprising a primary winding L' and a secondary winding L", as shown in FIG. 5.

Figure 1:
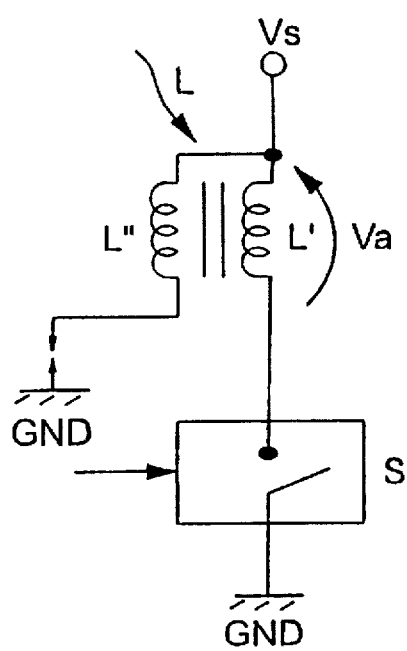
FIG. 1 is a simplified diagram of an electronic ignition device for an internal combustion engine.
Figures 2, 7:
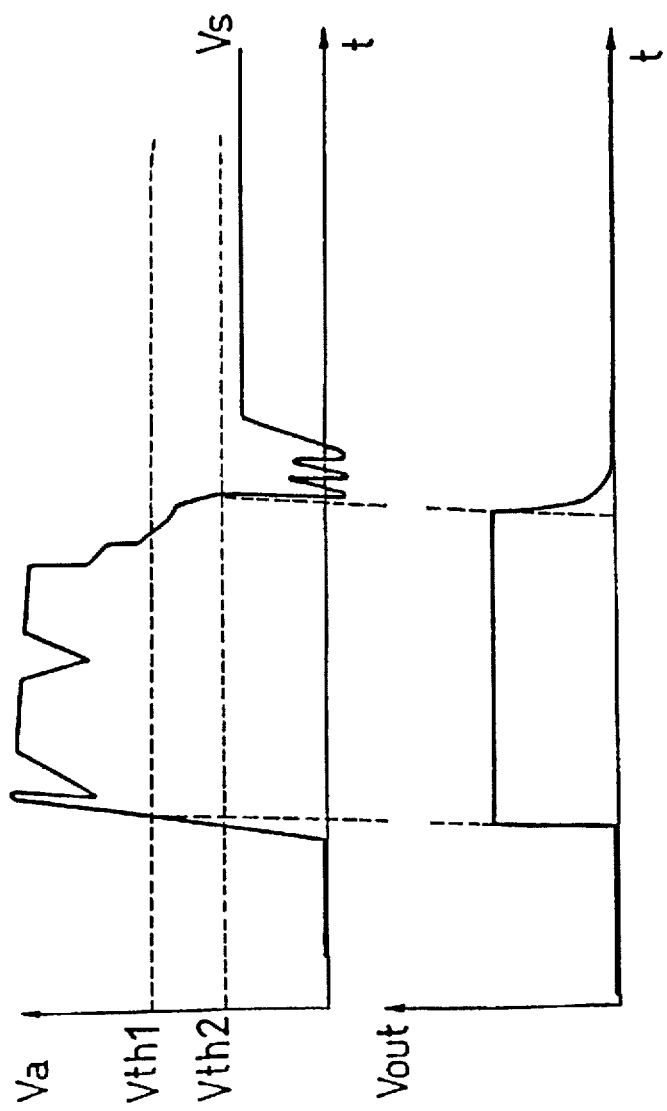

An initial condition in which switch S is open will also be considered. In this case it is found that a voltage Va, which changes as shown in FIGS. 2 and 3 according to whether a spark in the secondary winding L" of the coil is absent or present, is present across the ends of primary winding L' of ignition coil L. The peak value of voltage Va is approximately 400 V if a spark is absent and approximately 250 V if a spark is present.

The case in which there is no spark in secondary winding L" of coil L will first be considered assuming that a first condition exists in which:

$$Va > Vzn + (R1+R2) \times E2/R2 = Vth1 \quad (1),$$

where Vzn is the voltage present across the terminals of one-way block ZN, which in this application is approximately 40V, E2 is of the order of 1 volt and Vth1 is a first threshold value. It follows from condition (1) that:

$$V2 > E2.$$

It is also assumed that a second condition exists in which:

$$V1 > Vs + E1 = Vth2 \quad (2),$$

where V1=V2+Vzn, Vs is the supply voltage, which in this application is the same as the vehicle's battery voltage and lies between approximately 6V and approximately 24V, E1 is of the order of a few volts and Vth2 is a second threshold value. The existence of both conditions (1) and (2) implies that the first threshold comparator C1 and the second threshold comparator C2 perform a switching operation, providing their output terminals with the voltage signals Vc1 and Vc2 which are at a high logic level. Voltage Vc2 activates logic gate P1 to provide the output voltage signal Vp1 which is itself at a high logic level. As a consequence, because logic gate P2 has a high logic level on both its inputs, it is activated to provide the output voltage signal Vp2 which is also at a high logic level. The voltage Vp2 causes output transistor T1 to become active. When the transistor becomes active, the OUT output terminal of circuit 1 has a voltage Vout=Vp2−VbeT1 and capacitor Cout begins to charge up. It is also assumed that a third condition exists in which:

$$Vout > E3 \quad (3),$$

with E3 of the order of 1 volt. When this third condition exists, the third threshold comparator C3 produces a high logic level at the output Vc3. With both its inputs thus at a high logic level, logic gate P1 continues to maintain its output Vp1 at a high logic level. Under these conditions Vout remains at the value Vp2−VbeT1 and capacitor Cout remains charged.

If the current flowing through one-way block ZN is I, then:

$$Va = Vzn + (R1+R2) \times I,$$

when Va~=Vzn, I essentially zero and as a consequence Va becomes equal to V1. In this situation then also $$V2 = R2 \times I = 0.$$

However, if condition (2) is still fulfilled, and therefore:

$$V1 = Va > Vth2,$$

first threshold comparator C1 continues to maintain its output Vc1 at a high logic level while second threshold comparator C2 switches state, and its output Vc2 falls to the low logic level. As capacitor Cout is charged to a voltage Vout>E3, third threshold comparator C3 maintains its output Vc3 at a high logic level and Vp1 is held at a high logic level at the output from logic gate P1. In turn, as logic gate P2 still has inputs at a high logic level, its output Vp2 remains at a high logic level, and as a consequence output transistor T1 remains active.

When it is then found that:

$$Va = V1 < Vth2$$

first threshold comparator C1 switches state, and output Vc1 falls to the low logic level. As a consequence, logic gate P2 also switches, and its output Vp2 drops to zero volts deactivating output transistor T1.

In these circumstances the course of the voltage at Vout follows that of capacitor Cout as it discharges through resistor Rout. More specifically, the course of the voltage at Vout is that shown in FIG. 7. It should be pointed out that once the voltage at vout has fallen below the value of reference voltage E3, it does not become positive again unless condition (1) is reestablished.

An identical method of functioning to that just described occurs when there is a spark in secondary winding L" of ignition coil L. In this case however there is a problem associated with the course of the voltage Va.

As shown in FIG. 3, after a first short-lived overvoltage of approximately 10 μs, voltage Va in fact undergoes a sequence of alternations from zero to approximately between 70 to 80 V in rapid succession lasting a few tenths of a microsecond. From what has been said above it follows that when Va<Vth2, output transistor T1 becomes deactivated and capacitor Cout begins to discharge. Under these circumstances, capacitor Cout and resistor Rout have to be dimensioned so that condition Vout>E3 still exists throughout the sequence of alternations encountered by the voltage Va. In this way, third comparator C3 in fact maintains its output Vc3 at a high logic level. It is then necessary for voltage Va to rise above second threshold value Vth2 in order for voltage Vc2 to be again at a high logic level. In this way logic gate P2 is activated again to provide an output voltage Vp2 at a high logic level, which reactivates output transistor T1.

If there is a spark in secondary winding L" of ignition coil L, the course of voltage Vout is therefore that shown in FIG. 8.

Also, as shown in FIGS. 2 and 3, once the spark in secondary winding L" of coil L has been exhausted, voltage Va shows a transient to zero and then stops at the supply voltage Vs, which is less than the second threshold voltage Vth2. As a consequence, the voltage at Vout tends to zero over the discharge time of capacitor Cout discharging through resistor Rout, as shown in FIGS. 7 and 8.

It should be pointed out that circuit 1 and control switch S, which is constructed for example using a power transistor, may be incorporated into the same silicon chip using well-known power integrated circuit technology, in which the power stage is preferably of the vertical DMOS type of structure. This results in the filtering of voltage Va through capacitor Cout being performed only at the output from circuit 1. In fact, because of the alternation which voltage Va undergoes when a spark is present in secondary winding L" of coil L, which causes it to adopt negative values with respect to ground, any filtering performed at an intermediate point in circuit 1 would be negated through the activation of spurious active components which would deactivate the circuit itself.

Figure 6:
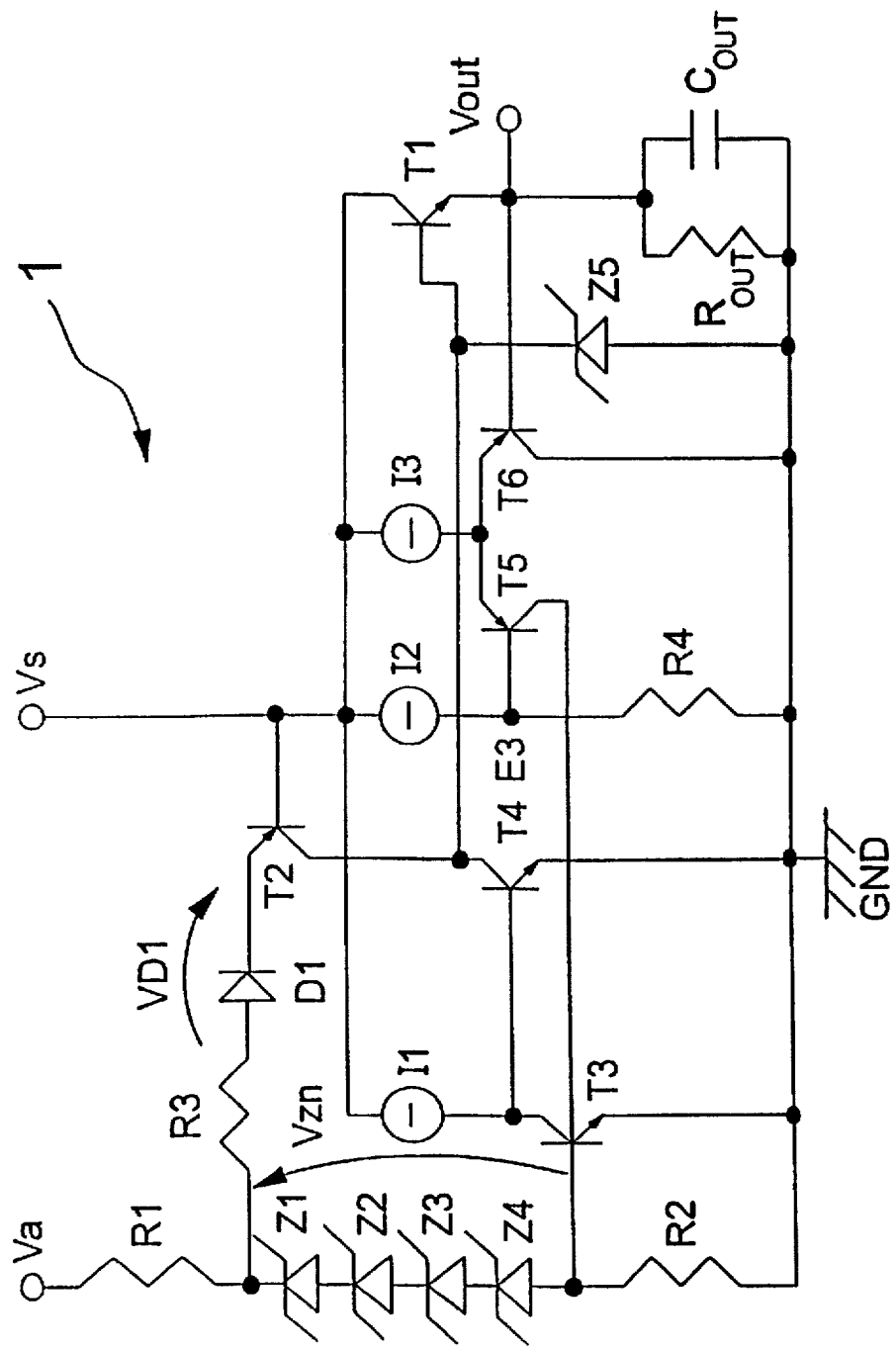
FIG. 6 shows an embodiment of the circuit of the block diagram illustrated in FIG. 4.

FIG. 6 shows a preferred embodiment of circuit 1 according to the invention. With reference to this figure, one-way block ZN comprises first Z1, second Z2, third Z3 and fourth Z4 Zener diodes which are connected together in series. First threshold comparator C1 comprises a second, transistor T2, of the PNP type, while second threshold comparator C2 and first logic gate P1 are provided by a third transistor T3, of the NPN type. A conventional diode D1 is connected to an emitter terminal of second transistor T2 to provide first reference voltage E1. The second logic gate P2 is provided by a fourth transistor T4, of the NPN type, while a fifth transistor T5 and a sixth T6, of the PNP type, in a mirror-current connection, provide third threshold comparator C3. Circuit 1 also comprises a Zener diode Z5, connected to a control terminal of the output transistor T1 and the ground terminal GND.

As far as the functioning of the embodiment of the circuit just described is concerned, when voltage Va is less than voltage Vzn present at the ends of the chain of Zener diodes Z1, Z2, Z3, Z4, third transistor T3 is deactivated while fourth transistor T4 is activated and keeps output transistor T1 deactivated. As a consequence voltage Vout is equal to zero.

When on the other hand voltage Va rises above voltage Vzn, current I, which flows in the chain of Zener diodes Z1, Z2, Z3, Z4 activates third transistor T3 which causes fourth transistor T4 to be deactivated. At the same time, second transistor T2 also becomes active providing an output current which causes output transistor T1 to become active. When this transistor becomes active, voltage Vout rises to a value which is greater than zero. It should be pointed out that the existence of diode Z5 causes the voltage at Vout not to exceed a maximum value of Vz5−VbeT1. In addition to this, if the condition:

$$Vout > E3$$

exists, the comparator formed by fifth transistor T5 and sixth T6 switches, causing T6 to be deactivated and T5 to be activated, keeping third transistor T3 active. The latter continues to keep fourth transistor T4 inactive.

When voltage Va again falls below voltage Vzn, current I flowing in the chain of Zener diodes Z1, Z2, Z3, Z4 becomes equal to zero. However, if the condition:

$$Va > Vs + VbeT2 + VD1$$

exists, second transistor T2 continues to remain active, keeping output transistor T1 activated. If on the other hand:

$$Va < Vs + VbeT2 + VD1$$

exists, second transistor T2 is deactivated, and no longer provides any current to output transistor T1, which is in turn deactivated. As a consequence voltage Vout begins to fall as capacitor Cout discharges through resistor Rout. However, as long as:

$$Vout > E3$$

fifth transistor T5 continues to remain active, keeping third transistor T3 active. In turn, third transistor T3 keeps fourth transistor T4 inactive. In these circumstances it is then sufficient for voltage Va to rise above the threshold value Vs+Vd1+VbeT2 in order to again activate second transistor T2, which causes output transistor T1 to become activated. In this way the voltage at Vout again adopts a value which is greater than zero.

When however voltage Va falls below the threshold value for a sufficiently long time to allow the voltage at Vout to fall below reference voltage E3, then sixth transistor T6 becomes active and fifth transistor T5 becomes inactive. As a consequence, third transistor T3 also becomes inactive, while fourth transistor T4 becomes active, rendering output transistor T1 definitively inactive. The latter can only be made active again when voltage Va again exceeds voltage Vzn, reactivating the chain of Zener diodes Z1, Z2, Z3, Z4. At this point the cycle which has just been described is repeated.

What is claimed is:

1. A circuit for detecting an overvoltage in an electrical load connected to a feed line and a control switch, the circuit having a voltage signal at an output terminal and comprising:

a first threshold comparator having an output terminal, a first input terminal held at a first reference voltage and a second input terminal connected to the feed line;

a second threshold comparator having an output terminal, a first input terminal held at a second reference voltage and a second input terminal connected to the electrical load;

an output transistor connected to the feed line and the output terminal of the circuit, the transistor being driven by a logic block having inputs connected to the outputs of the first and second threshold comparators and, a feedback block connected to the output terminal of the circuit and a further input terminal of the logic block.

2. The circuit of claim 1, wherein the feedback block includes a third threshold comparator having an output terminal, a first input terminal held at a third reference voltage and a second input terminal connected to the output terminal of the circuit.

3. The circuit of claim 2, wherein the logic block comprises:

a first logic gate having an output terminal, a first input terminal connected to the output terminal of the second threshold comparator and a second input terminal connected to the output terminal of the third threshold comparator; and a second logic gate having a first input terminal connected to the output terminal of the first comparator, a second input terminal connected to the output terminal of the first logic gate and an output terminal capable of controlling the output transistor.

4. The circuit of claim 3, wherein the second input terminal of the second comparator is connected to the electric load through a one-way block connected in series to a first resistance element.

5. The circuit of claim 4, wherein a capacitor is connected to the output terminal of the circuit and a ground terminal, and a second resistance element is connected in parallel with the capacitor.

6. The circuit of claim 4, wherein the first logic gate is of the OR type and the second logic gate is of the AND type.

7. The circuit of claim 4, wherein the output transistor is of the NPN type.

8. An overvoltage detection circuit for use in an electronic ignition system having a feed line and a ground terminal and including an ignition coil having primary and secondary windings, the primary winding being connected between the feed line and an input terminal of the overvoltage detection circuit and the secondary winding being connected between the feed line and the ground terminal, the overvoltage detection circuit comprising:

a power switch having a control terminal and first and second power terminals; and a sensing circuit connected in parallel with the power switch and in series with the primary winding, the sensing circuit having an input terminal for receiving an overvoltage event present on the primary winding of the ignition coil, and an output terminal for producing an output voltage signal proportional to a time duration of the overvoltage event, the sensing circuit including logic gates responsive to the detection of the overvoltage event in the primary winding to maintain the output terminal at a high logic level during the time duration of the overvoltage event.

9. The circuit of claim 8, wherein the sensing circuit detects an onset of the overvoltage event as determinated when the voltage on the primary winding exceeds a first threshold voltage, and then detects a termination of the overvoltage event as determinated when the voltage on the primary winding falls below a second threshold voltage.

10. The circuit of claim 9, wherein the sensing circuit further comprises:

a comparator block having a first input terminal connected to the feed line, a second input terminal held to a first reference voltage, a third input terminal coupled to the input terminal of the sensing circuit, a fourth input terminal held to a second reference voltage and first and second output terminals connected to the logic gates;

an output transistor having a first terminal connected to the feed line, a second terminal connected to the output terminal of the sensing circuit and a control terminal connected to the logic gates, wherein the logic gates have inputs for receiving digital signals generated by the comparator block; and a feedback block connected to the output terminal of the sensing circuit and a further input of the logic gates.

11. The circuit of claim 10, wherein the output transistor is an NPN bipolar transistor.

12. The circuit of claim 10, wherein a capacitor is connected between the output terminal of the sensing circuit and the ground terminal and a second resistance element is connected in parallel with the capacitor, wherein the capacitor holds the output terminal high while the overvoltage event is present, and the second resistance element provides a discharge path for the capacitor upon termination of the overvoltage event.

13. The circuit of claim 10, wherein the third input terminal of the comparator block is coupled to the input terminal of the sensing circuit through a one-way block connected in series with a first resistance element.

14. The circuit of claim 13, wherein the comparator block comprises a first threshold comparator having input terminals corresponding to the first and the second input terminals of the block comparator, and an output terminal corresponding to the first output terminal of the block comparator, the first threshold comparator providing an output digital signal at a high logic level when the voltage on the primary winding exceeds the first threshold voltage, wherein the output digital signal maintains the high logic level until the voltage on the primary winding falls below the second threshold voltage.

15. The circuit of claim 14, wherein the comparator block comprises a second threshold comparator having input terminals corresponding to the third and the fourth input terminals of the block comparator and an output terminal corresponding to the second output terminal of the block comparator, the second threshold comparator providing an output digital signal at a high logic level whenever the voltage on the primary winding exceeds the first threshold voltage.

16. The circuit of claim 15, wherein the first threshold voltage is proportional to a sum of a voltage on the one-way block and the second reference voltage.

17. The circuit of claim 15, wherein the second threshold voltage is proportional to a sum of a supply voltage on the feed line and the first reference voltage.

18. The circuit of claim 15, wherein the feedback block comprises a third threshold comparator having an output terminal, a first input terminal held at a third reference voltage and a second input terminal connected to the output terminal of the sensing circuit, the third threshold comparator providing an output digital signal at a high logic level when the output voltage signal of the sensing circuit exceeds the third reference voltage.

19. The circuit of claim 18, wherein the logic gates comprise:

a first logic gate having an output terminal and a first input terminal connected to the output terminal of the second threshold comparator and a second input terminal connected to the output terminal of the third threshold comparator; and a second logic gate having a first input terminal connected to the output terminal of the first comparator, a second input terminal connected to the output terminal of the first logic gate and an output terminal connected to the control terminal of the output transistor.

20. The circuit of claim 19, wherein the first logic gate is of the OR type and the second logic gate is of the AND type.

21. A method for detecting a spark in an ignition system having an ignition coil with primary and secondary windings, the method comprising the steps of:

generating an overvoltage event on the primary winding of the ignition coil;

detecting an onset of the overvoltage event and in response producing an output voltage signal at a high logic level when the voltage on the primary winding exceeds a first threshold voltage;

maintaining the output voltage signal at the high logic level during a time duration of the overvoltage event, wherein the time duration has a first value if a spark is present and a second value if a spark is absent on the secondary winding of the ignition coil; and detecting a termination of the overvoltage event and in response producing an output voltage signal at a low logic level when the voltage on the primary winding falls below a second threshold voltage.

22. The method of claim 21, wherein the step of detecting the onset of the overvoltage event comprises the steps of:

generating first and second digital signals at a high logic level when the voltage on the primary winding of the ignition coil exceeds the first threshold voltage; and logically combining the first and the second digital signals to maintain the voltage signal at the high logic level.

23. The method of claim 22, wherein the step of maintaining the output voltage signal at the high logic level comprises the steps of:

generating a third digital signal at a high logic level during the time duration of the overvoltage event;

maintaining the first digital signal at the high logic level when the voltage on the primary winding falls below the first threshold voltage; switching the second digital signal to a low logic level when the voltage on the primary winding falls below the first threshold voltage; and logically combining the first and the third digital signals to maintain the output voltage signal at the high logic level.

24. The method of claim 23, wherein the step of detecting the termination of the overvoltage event comprises the steps of:

switching the first digital signal to a low logic level when the voltage on the primary winding falls below the second threshold voltage; and logically combining the first and the second digital signals to switch the output voltage signal to a low logic level.

* * * * *